US012641815B2

(12) United States Patent
Ono et al.

(10) Patent No.: US 12,641,815 B2
(45) Date of Patent: May 26, 2026

(54) SEMICONDUCTOR DEVICE

(71) Applicant: KABUSHIKI KAISHA TOSHIBA, Tokyo (JP)

(72) Inventors: Hiroshi Ono, Setagaya (JP); Yosuke Kajiwara, Yokohama (JP); Daimotsu Kato, Kawasaki (JP); Masahiko Kuraguchi, Yokohama (JP); Tatsuo Shimizu, Shinagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 797 days.

(21) Appl. No.: 17/817,681

(22) Filed: Aug. 5, 2022

(65) Prior Publication Data

US 2023/0253487 A1 Aug. 10, 2023

(30) Foreign Application Priority Data

Feb. 8, 2022 (JP) ................................. 2022-017621

(51) Int. Cl.
   *H10D 30/47* (2025.01)
   *H10D 62/824* (2025.01)
   (Continued)

(52) U.S. Cl.
   CPC ......... *H10D 30/475* (2025.01); *H10D 62/824* (2025.01); *H10D 62/8503* (2025.01); *H10D 64/411* (2025.01)

(58) Field of Classification Search
   CPC .................................................. H10D 64/513
   See application file for complete search history.

(56) References Cited

U.S. PATENT DOCUMENTS

2013/0153925 A1* 6/2013 Masuda .............. H01L 21/0475
                                                                257/77
2017/0077277 A1* 3/2017 Saito ................... H01L 23/3178
                    (Continued)

FOREIGN PATENT DOCUMENTS

JP     2011-124509 A    6/2011
JP     2020-150141 A    9/2020
                    (Continued)

OTHER PUBLICATIONS

Nozaki, M. et al. "Implementation of atomic layer deposition-based AION gate dielectrics in AlGaN/GaN MOS structure and its physical and electrical properties" Japanese Journal of Applied Physics 57, 06KA02. (2018) 8 pages.

*Primary Examiner* — Minsun O Harvey
*Assistant Examiner* — Stephen Sutton Kotter
(74) *Attorney, Agent, or Firm* — Oblon, McClelland, Maier & Neustadt, L.L.P.

(57) ABSTRACT

According to one embodiment, a semiconductor device includes first to third electrodes, first and second semiconductor regions, a first insulating member, and a nitride member. The third electrode includes a first electrode portion. A position of the first electrode portion is between a position of the first electrode and a position of the second electrode. The first semiconductor region includes first to fifth partial regions. A position of the fourth partial region is between positions of the first and third partial regions. A position of the fifth partial region is between positions of the third and second partial regions. The second semiconductor region includes first and second semiconductor portions. The first electrode portion is located between the first and second semiconductor portions. The first insulating member includes first to third insulating regions. The nitride member includes first to third nitride regions.

20 Claims, 6 Drawing Sheets

(51) Int. Cl.
 *H10D 62/85* (2025.01)
 *H10D 64/27* (2025.01)

(56) References Cited

U.S. PATENT DOCUMENTS

| 2020/0027976 A1* | 1/2020 | Mukai ................ H10D 30/4732 |
|---|---|---|
| 2020/0220003 A1* | 7/2020 | Kuraguchi ........... H10D 30/475 |
| 2020/0295169 A1* | 9/2020 | Kato .................... H10D 64/513 |
| 2021/0118984 A1 | 4/2021 | Shimizu |
| 2021/0288175 A1 | 9/2021 | Shimizu et al. |

FOREIGN PATENT DOCUMENTS

| JP | 2021-68722 A | 4/2021 |
|---|---|---|
| JP | 2021-145113 A | 9/2021 |

* cited by examiner

SEMICONDUCTOR DEVICE

CROSS-REFERENCE TO RELATED APPLICATIONS

This application is based upon and claims the benefit of priority from Japanese Patent Application No. 2022-017621, filed on Feb. 8, 2022; the entire contents of which are incorporated herein by reference.

FIELD

Embodiments of the invention generally relate to a semiconductor device.

BACKGROUND

For example, there is a semiconductor device using a nitride semiconductor. It is desired to improve the characteristics of semiconductor devices.

DETAILED DESCRIPTION

Figure 1:
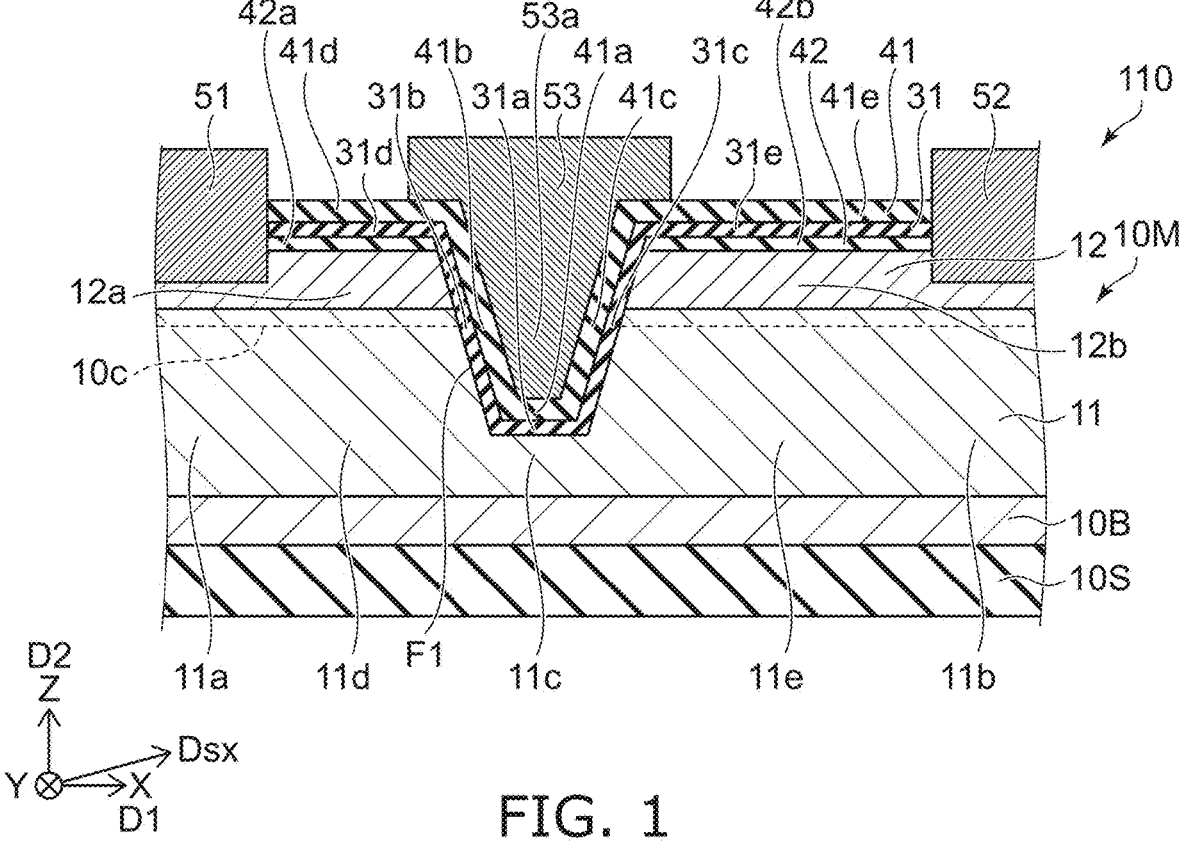
FIG. 1 is a schematic cross-sectional view illustrating a semiconductor device according to a first embodiment.

According to one embodiment, a semiconductor device includes a first electrode, a second electrode, a third electrode, a first semiconductor region, a second semiconductor region, a first insulating member, and a nitride member. The third electrode includes a first electrode portion. A position of the first electrode portion in a first direction from the first electrode to the second electrode is between a position of the first electrode in the first direction and a position of the second electrode in the first direction. The first semiconductor region includes $Al_{x1}Ga_{1-x1}N$ ($0 \leq x1 < 1$). The first semiconductor region includes a first partial region, a second partial region, a third partial region, a fourth partial region, and a fifth partial region. A direction from the first partial region to the first electrode is along a second direction crossing the first direction. A direction from the second partial region to the second electrode is along the second direction. A direction from the third partial region to the first electrode portion is along the second direction. A position of the fourth partial region in the first direction is between a position of the first partial region in the first direction and a position of the third partial region in the first direction. A position of the fifth partial region in the first direction is between the position of the third partial region in the first direction and a position of the second partial region in the first direction. The second semiconductor region includes $Al_{x2}Ga_{1-x2}N$ ($0 < x2 \leq 1$, $x1 < x2$). The second semiconductor region includes a first semiconductor portion and a second semiconductor portion. The first electrode portion is located between the first semiconductor portion and the second semiconductor portion in the first direction. A direction from the fourth partial region to the first semiconductor portion is along the second direction. A direction from the fifth partial region to the second semiconductor portion is along the second direction. The first insulating member includes a first insulating region, a second insulating region, and a third insulating region. The first insulating region is located between the third partial region and the first electrode portion in the second direction. The second insulating region is located between the first semiconductor portion and the first electrode portion in the first direction. The third insulating region is located between the first electrode portion and the second semiconductor portion in the first direction. The nitride member includes a first nitride region, a second nitride region and a third nitride region. The first nitride region is located between the third partial region and the first insulating region in the second direction. The second nitride region is located between the first semiconductor portion and the second insulating region in the first direction. The third nitride region is located between the third insulating region and the second semiconductor portion in the first direction. The first nitride region includes $Al_{z1}Ga_{1-z1}N$ ($0 < z1 < 1$, $x1 < z1$). The second nitride region includes $Al_{z2}Ga_{1-z2}N$ ($0 < z2 \leq 1$, $z1 < z2$).

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIG. 1 is a schematic cross-sectional view illustrating a semiconductor device according to the first embodiment.

As shown in FIG. 1, a semiconductor device 110 according to the embodiment includes a first electrode 51, a second electrode 52, a third electrode 53, a first semiconductor region 11, a second semiconductor region 12, a first insulating member 41, and a nitride. Includes member 31.

A direction from the first electrode 51 to the second electrode 52 is defined as a first direction D1. The first direction D1 is, for example, an X-axis direction. One direction perpendicular to the X-axis direction is defined as a Z-axis direction. The direction perpendicular to the X-axis direction and the Z-axis direction is defined as a Y-axis direction. For example, the first to third electrodes 51 to 53 may extend in the Y-axis direction.

The third electrode 53 includes a first electrode portion 53a. A position of the first electrode portion 53a in the first direction D1 is between a position of the first electrode 51 in the first direction D1 and a position of the second electrode 52 in the first direction D1.

The first semiconductor region 11 includes $Al_{x1}Ga_{1-x1}N$ ($0 \leq x1 < 1$). The first semiconductor region 11 includes, for example, GaN. The composition ratio x1 is, for example, not less than 0 and less than 0.1.

The first semiconductor region 11 includes a first partial region 11a, a second partial region 11b, a third partial region 11c, a fourth partial region 11d, and a fifth partial region 11e. A direction from the first partial region 11a to the first electrode 51 is along a second direction D2. The second direction D2 crosses the first direction D1. The second direction D2 is, for example, the Z-axis direction. The second direction D2 may be perpendicular to the first direction D1.

A direction from the second partial region 11b to the second electrode 52 is along the second direction D2. A direction from the third partial region 11c to the first electrode portion 53a is along the second direction D2. A position of the fourth partial region 11d in the first direction D1 is between a position of the first partial region 11a in the first direction D1 and a position of the third partial region 11c in the first direction D1. A position of the fifth partial region 11e in the first direction D1 is between the position of the third partial region 11c in the first direction D1 and a position of the second partial region 11b in the first direction D1. The boundaries between the first to fifth partial regions 11a to 11e may be unclear. These partial regions may be contiguous with each other.

The second semiconductor region 12 includes $Al_{x2}Ga_{1-x2}N$ ($0 < x2 \leq 1$, $x1 < x2$). The second semiconductor region 12 includes, for example, AlGaN. The composition ratio x2 is, for example, not less than 0.1 and not more than 1. The composition ratio x2 may be, for example, not less than 0.1 and not more than 0.5.

The second semiconductor region 12 includes a first semiconductor portion 12a and a second semiconductor portion 12b. The first electrode portion 53a is located between the first semiconductor portion 12a and the second semiconductor portion 12b in the first direction D1. A direction from the fourth partial region 11d to the first semiconductor portion 12a is along the second direction D2. A direction from the fifth partial region 11e to the second semiconductor portion 12b is along the second direction D2.

The first insulating member 41 includes a first insulating region 41a, a second insulating region 41b, and a third insulating region 41c. The first insulating region 41a is located between the third partial region 11c and the first electrode portion 53a in the second direction D2. The second insulating region 41b is located between the first semiconductor portion 12a and the first electrode portion 53a in the first direction D1. The third insulating region 41c is located between the first electrode portion 53a and the second semiconductor portion 12b in the first direction D1. The boundaries between the first to third insulating regions 41a to 41c may be unclear. These insulating regions may be continuous with each other.

The nitride member 31 includes a first nitride region 31a, a second nitride region 31b, and a third nitride region 31c. The first nitride region 31a is located between the third partial region 11c and the first insulating region 41a in the second direction D2. The second nitride region 31b is located between the first semiconductor portion 12a and the second insulating region 41b in the first direction D1. The third nitride region 31c is located between the third insulating region 41c and the second semiconductor portion 12b in the first direction D1. The boundaries between the first to third nitride regions 31a to 31c may be unclear. These nitride regions may be continuous with each other.

The first nitride region 31a includes $Al_{z1}Ga_{1-z1}N$ ($0 < z1 < 1$, $x1 < z1$). The second nitride region 31b includes $Al_{z2}Ga_{1-z2}N$ ($0 < z2 \leq 1$, $z1 < z2$). Thus, regions having different Al composition ratio are provided in the first nitride member 31. In one example, the second nitride region 31b includes AlN. The first nitride region 31a includes AlGaN. For example, the composition ratio z2 may be higher than the composition ratio x2.

The first semiconductor region 11 and the second semiconductor region 12 are included in a semiconductor member 10M. The semiconductor device 110 may include a base body 10S and a nitride layer 10B. The base body 10S may include, for example, a silicon substrate, a GaN substrate, a SiC substrate, or the like. The nitride layer 10B may include a nitride semiconductor. The nitride layer 10B is, for example, a buffer layer. The nitride layer 10B is provided on the base body 10S.

The semiconductor member 10M is provided on the nitride layer 10B. The first to third electrodes 51 to 53 are provided on the semiconductor member 10M.

The first electrode 51 is electrically connected with the first semiconductor portion 12a. The second electrode 52 is electrically connected with the second semiconductor portion 12b.

A current flowing between the first electrode 51 and the second electrode 52 can be controlled by a potential of the third electrode 53. The potential of the third electrode 53 may be, for example, a potential based on a potential of the first electrode 51. The first electrode 51 functions as, for example, a source electrode. The second electrode 52 functions as, for example, a drain electrode. The third electrode 53 functions as, for example, a gate electrode. The semiconductor device 110 is a transistor.

A carrier region 10c is formed in a portion of the first semiconductor region 11 facing the second semiconductor region 12. The carrier region 10c is, for example, a two-dimensional electron gas. The semiconductor device 110 is, for example, a HEMT (High Electron Mobility Transistor).

As described above, the first electrode portion 53a of the third electrode 53 is located between the first semiconductor portion 12a and the second semiconductor portion 12b in the first direction D1. As shown in FIG. 1, a part of the first electrode portion 53a may be located between the fourth partial region 11d and the fifth partial region 11e in the first direction D1. The third electrode 53 is, for example, a recess type gate electrode. Thereby, a high threshold is obtained. For example, a normally-off operation can be obtained.

In the embodiment, as described above, the composition ratio is different between the first nitride region 31a provided at the bottom of the recess and the second nitride region 31b provided at the side of the recess. The composition ratio of Al in the first nitride region 31a is lower than the composition ratio of Al in the second nitride region 31b. This suppresses excessive carrier formation at the bottom of the recess.

If the carrier concentration becomes excessively high at the bottom of the recess, for example, a short channel effect occurs. This may cause the threshold voltage to decrease excessively. In the embodiment, excessively high carrier concentration is suppressed at the bottom of the recess. As a result, the threshold voltage can be stably controlled to the target voltage. For example, high channel mobility is maintained. High carrier mobility and stable high threshold voltage can be obtained. According to the embodiment, it is possible to provide a semiconductor device whose characteristics can be improved.

In the semiconductor device 110, the third nitride region 31c includes $Al_{z3}Ga_{1-z3}N$ ($0 < z3 \leq 1$, $z1 < z3$). The third nitride region 31c includes AlN, for example. In the embodiment, the composition ratio of Al in the nitride regions (the second nitride region 31b and the third nitride region 31c) of the two sides may be higher than the composition ratio of Al in the first nitride region 31a. For example, the composition ratio z3 may be higher than the composition ratio x2.

In the embodiment, the first insulating member 41 includes silicon and oxygen. The first insulating member 41 includes, for example, $SiO_2$.

As shown in FIG. 1, the semiconductor device 110 may further include a second insulating member 42. The second insulating member 42 includes a first insulating portion 42a and a second insulating portion 42b. The first semiconductor portion 12a is located between the fourth partial region 11d and the first insulating portion 42a in the second direction D2. The second semiconductor portion 12b is located between the fifth partial region 11e and the second insulating portion 42b in the second direction D2. The second insulating member 42 includes silicon and nitrogen. The second insulating member 42 includes, for example, SiN. The second insulating member 42 functions as, for example, a protective film. The second insulating member 42 maintains high quality in the second semiconductor region 12.

As shown in FIG. 1, in this example, the nitride member 31 includes a fourth nitride region 31d and a fifth nitride region 31e. The first insulating portion 42a is located between the first semiconductor portion 12a and the fourth nitride region 31d in the second direction D2. The second insulating portion 42b is located between the second semiconductor portion 12b and the fifth nitride region 31e in the second direction D2.

In this example, the first insulating member 41 includes the fourth insulating region 41d and the fifth insulating region 41e. The fourth nitride region 31d is located between the first insulating portion 42a and the fourth insulating region 41d in the second direction D2. The fifth nitride region 31e is located between the second insulating portion 42b and the fifth insulating region 41e in the second direction D2.

Hereinafter, an example of the analysis results of the nitride member 31 in the semiconductor device 110 will be described.

FIGS. 2A to 2D and 3A to 3D are images illustrating the analysis results of the semiconductor device according to the first embodiment.

Figures 2A, 2B, 2C, 2D:
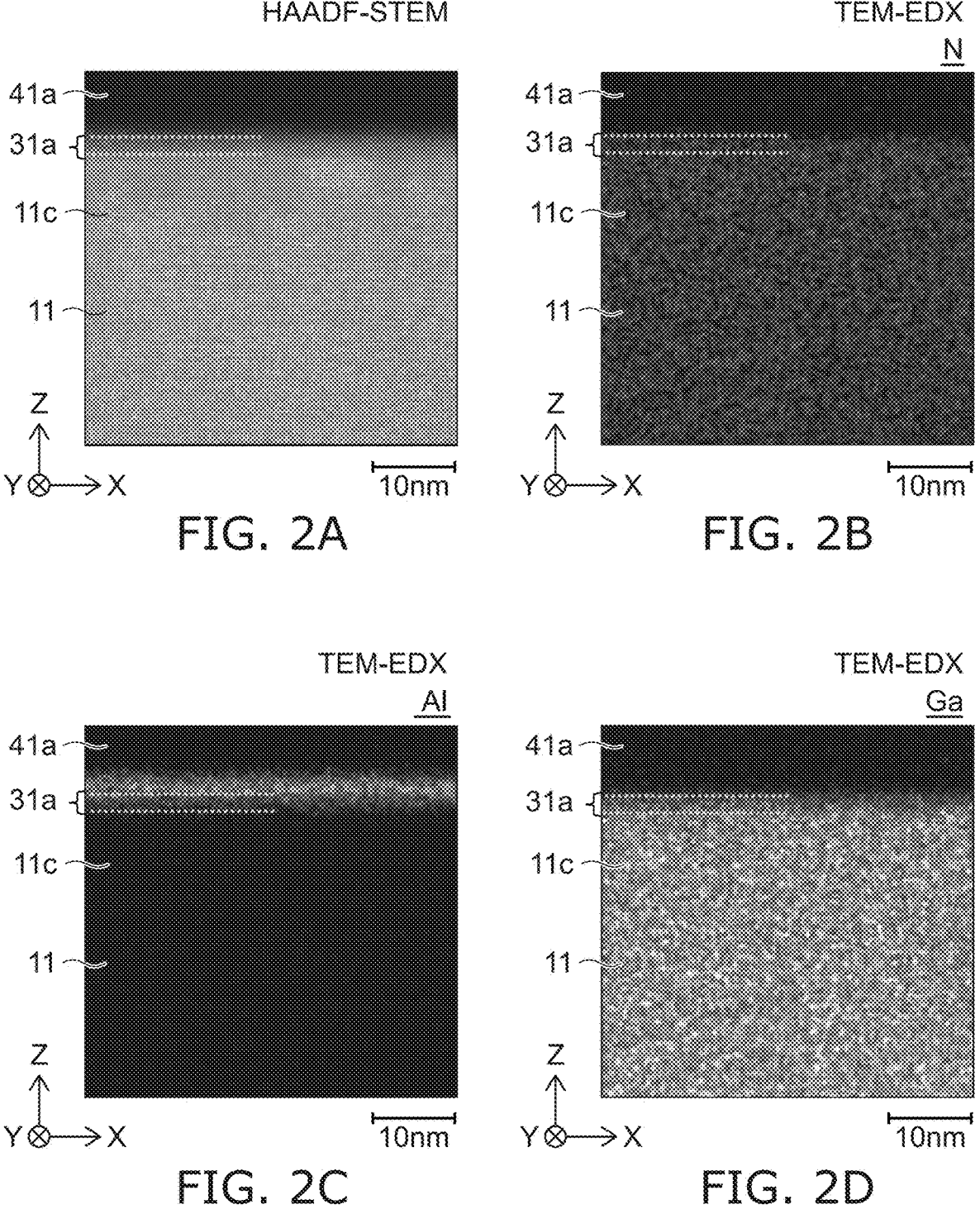
FIGS. 2A to 2D are images illustrating analysis results of the semiconductor device according to the first embodiment.
Figures 3A, 3B, 3C, 3D:
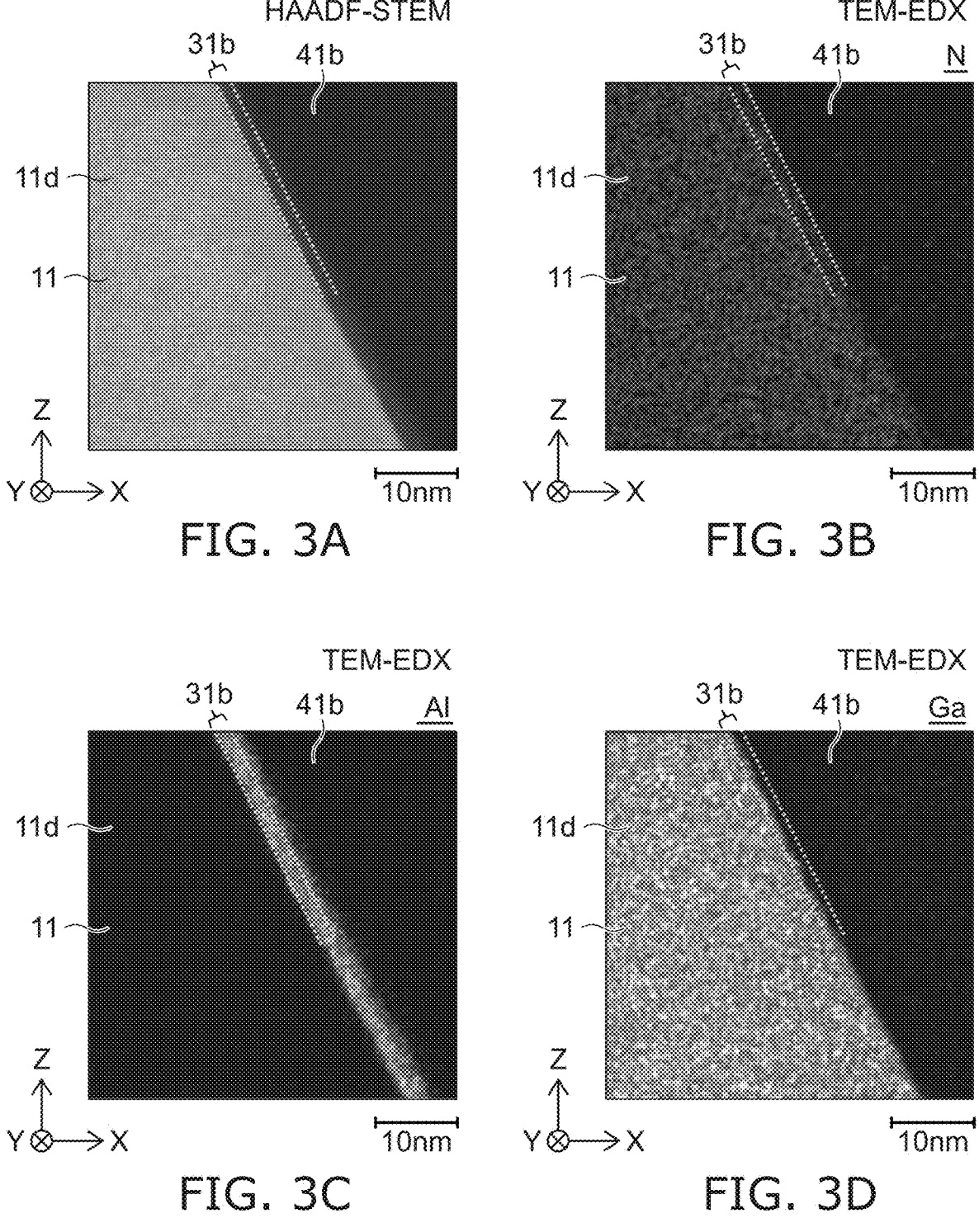
FIGS. 3A to 3D are images illustrating analysis results of the semiconductor device according to the first embodiment.

FIGS. 2A to 2D correspond to the first nitride region 31a at the bottom of the recess. FIGS. 3A to 3D correspond to the second nitride region 31b on the side of the recess. FIGS. 2A and 3A are HAADF-STEM ((High Angle Annular Dark-Field Scanning Transmission Electron Microscopy). FIGS. 2B to 2D, and FIGS. 3B to 3D are TEM (Transmission Electron Microscopy)-EDX (Energy dispersive X-ray spectroscopy). FIGS. 2B and 3B relate to nitrogen (N). In FIGS. 2B and 3B, the concentration of N in the bright region is higher than the concentration of N in the dark region. FIGS. 2C and 3C relate to Al. In FIGS. 2C and 3C, the concentration of Al in the bright region is higher than the concentration of Al in the dark region. FIGS. 2D and 3D relate to Ga. In FIGS. 2D and 3D, the concentration of Ga in the bright region is higher than the concentration of Ga in the dark region.

In FIGS. 2A to 2D, the first nitride region 31a is shown by a broken line. As shown in FIGS. 2B to 2D, N, Al and Ga exist in the first nitride region 31a.

In FIGS. 3A to 3D, the second nitride region 31b is shown by a broken line. As shown in FIGS. 3B to 3D, N and Al exist in the second nitride region 31b, and Ga is substantially not observed in the second nitride region 31b.

Hereinafter, an example of the elemental profile in the portion including the first nitride region 31a and the portion including the second nitride region 31b will be described. In the portion including the first nitride region 31a, a change in the concentration of the element is detected along the Z-axis direction. On the other hand, in the portion including the first nitride region 31a, a change in the concentration of the element is detected along the side vertical direction Dsx shown in FIG. 1. As shown in FIG. 1, the second nitride region 31b includes a first surface F1 facing the fourth partial region 11d. The side vertical direction Dsx is perpendicular to the first surface F1.

Figure 4A:
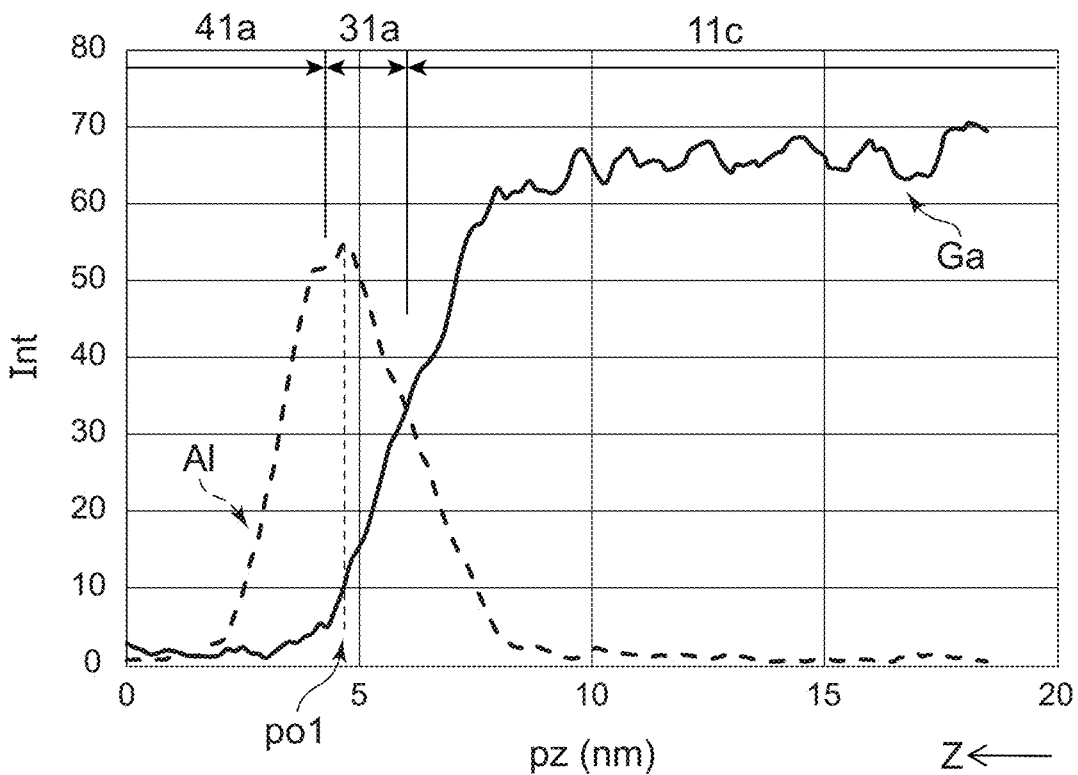
FIGS. 4A and 4B are graphs illustrating analysis results of the semiconductor device in the first embodiment.
Figure 4B:
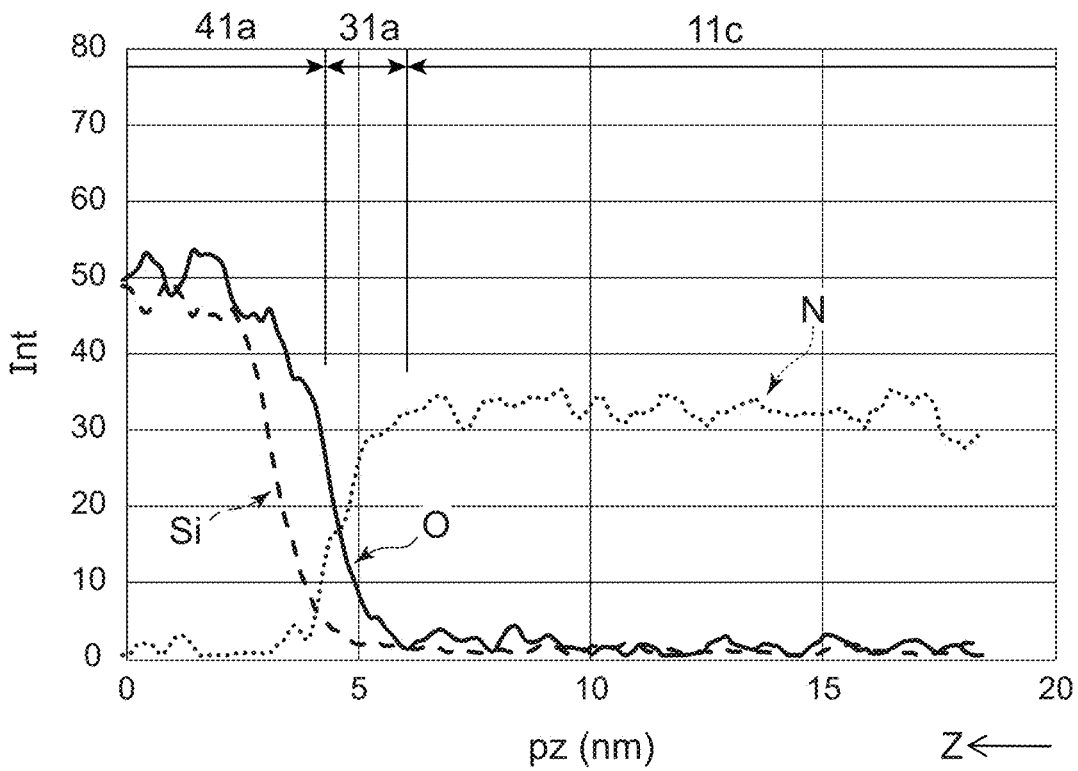

FIGS. 4A and 4B are graphs illustrating the analysis results of the semiconductor device in the first embodiment.

These figures relate to the first nitride region 31a. These figures illustrate the concentration of elements detected by EDX. The horizontal axis of these figures is a position pz in the Z-axis direction. The vertical axis is the detection intensity Int of the element. FIG. 4A shows the concentrations of Al and Ga. FIG. 4B shows the concentrations of N, Si and O.

As shown in FIG. 4A, Al and Ga exist in the first nitride region 31a. Ga and O may be detected in FIGS. 4A and 4B.

Figure 5A:
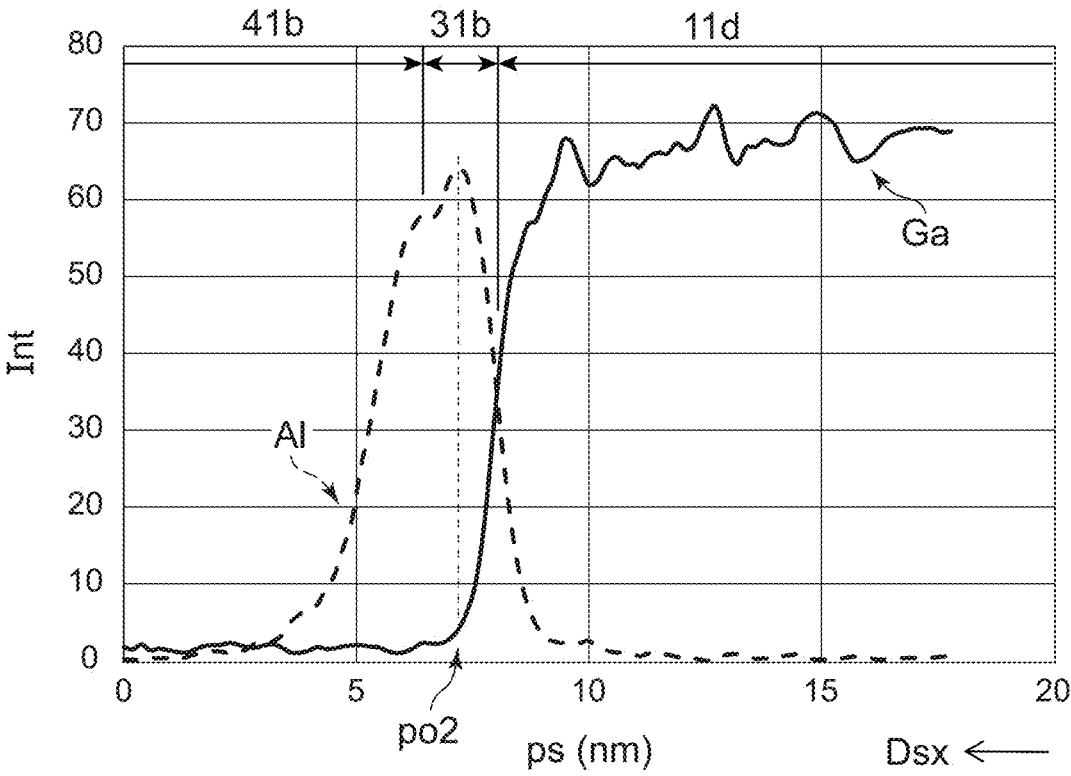
FIGS. 5A and 5B are graphs illustrating analysis results of the semiconductor device in the first embodiment.
Figure 5B:
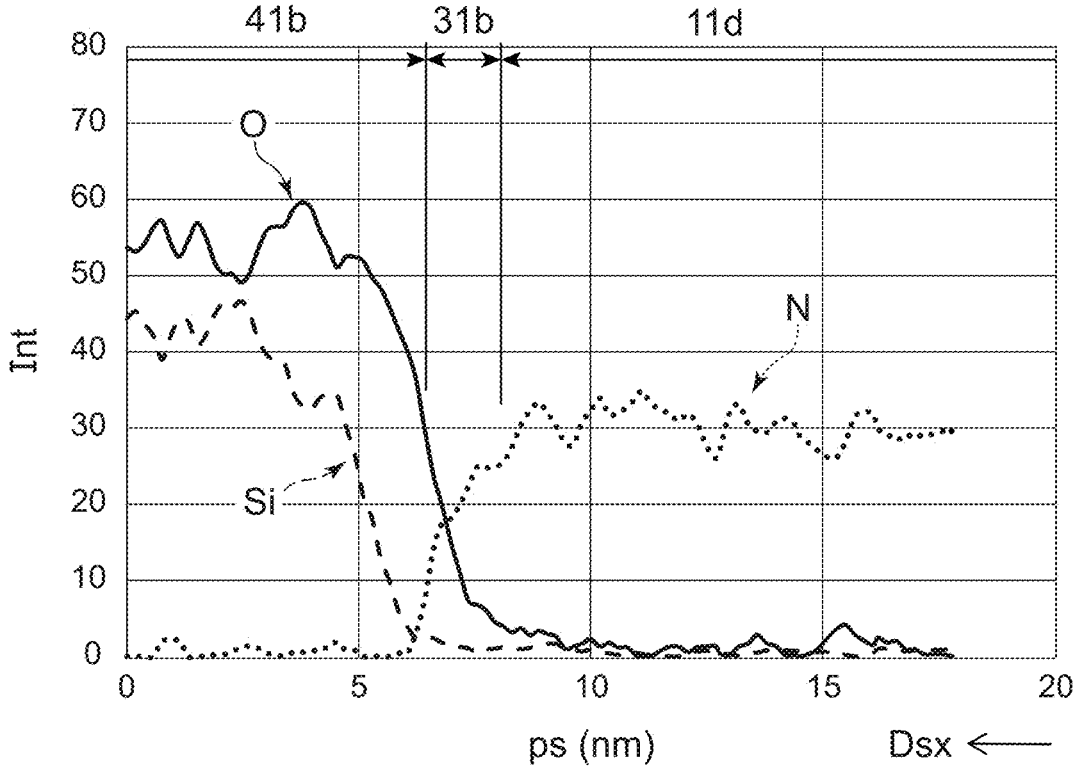

FIGS. 5A and 5B are graphs illustrating the analysis results of the semiconductor device in the first embodiment.

These figures relate to the second nitride region 31b. These figures illustrate the concentration of elements detected by EDX. The horizontal axis of these figures is a position ps in the side vertical direction Dsx. The vertical axis is the element detection intensity Int. FIG. 5A shows the concentrations of Al and Ga. FIG. 5B shows the concentrations of N, Si and O.

As shown in FIG. 5A, Al exists in the second nitride region 31b. In the second nitride region 31b, the concentration of Ga (detection intensity Int) sharply decreases.

As shown in FIG. 4A, in the first nitride region 31a, the peak of the detection intensity Int of Al is broad, and the detection intensity Int of Ga changes slowly. On the other hand, as shown in FIG. 5A, in the second nitride region 31b, the peak of the detection intensity Int of Al is sharp, and the detection intensity Int of Ga changes sharply.

For example, in the first nitride region 31a, a part of Ga included in the third partial region 11c may be diffused in the first nitride region 31a. For example, the excess Ga in the third partial region 11c moves to the first nitride region 31a, thereby stabilizing the composition in the third partial region 11c. For example, there are fewer nitrogen vacancies. For example, the crystallinity in the third partial region 11c is improved. This makes it easier to obtain higher carrier mobility.

For example, by trapping Ga in the first nitride region 31a, the movement of Ga to the first insulating region 41a (for example, $SiO_2$) is suppressed. As a result, a first insulating region 41a having higher quality can be obtained. For example, higher reliability can be obtained.

As shown in FIG. 4A, there is a distribution of Al concentration along the Z-axis direction (second direction D2) in the portion including the first nitride region 31a. The concentration of Al at the first position po1 included in the first nitride region 31a is a peak in the distribution of the concentration of Al along the second direction D2 in the first nitride region 31a. The concentration of Ga in the first position po1 is $1/10$ or more of the concentration of Ga in the third partial region 11c.

As shown in FIG. 5A, there is a distribution of Al concentration along the side vertical direction Dsx in the portion including the second nitride region 31b. As described above, the side vertical direction Dsx is perpendicular to the first surface F1 (see FIG. 1). The concentration of Al at the second position po2 included in the second nitride region 31b is a peak in the distribution of the concentration of Al along the side vertical direction Dsx in the second nitride region 31b. The concentration of Ga in the second position po2 is less than ⅒ of the concentration of Ga in the fourth partial region 11d.

By such a difference in composition between the first nitride region 31a and the second nitride region 31b, high carrier mobility and stable high threshold voltage can be obtained.

The concentration of Ga in the first nitride region 31a is, for example, not less than 10 atm % and not more than 30 atm %. The concentration of Ga in the second nitride region 31b is, for example, less than 10 atm %.

From the analysis of the TEM image on the semiconductor device 110, it was found that there is case where crystallinity differs between the first nitride region 31a and the second nitride region 31b. For example, the crystallinity of the second nitride region 31b is higher than the crystallinity of the first nitride region 31a. For example, in the first nitride region 31a, since Ga exists, there is a case where the crystallinity is relatively lower than that in the second nitride region 31b. Thereby, the short channel effect can be suppressed more effectively.

Ga included in the first nitride region 31a may be supplied from, for example, the third partial region 11c.

Figure 6:
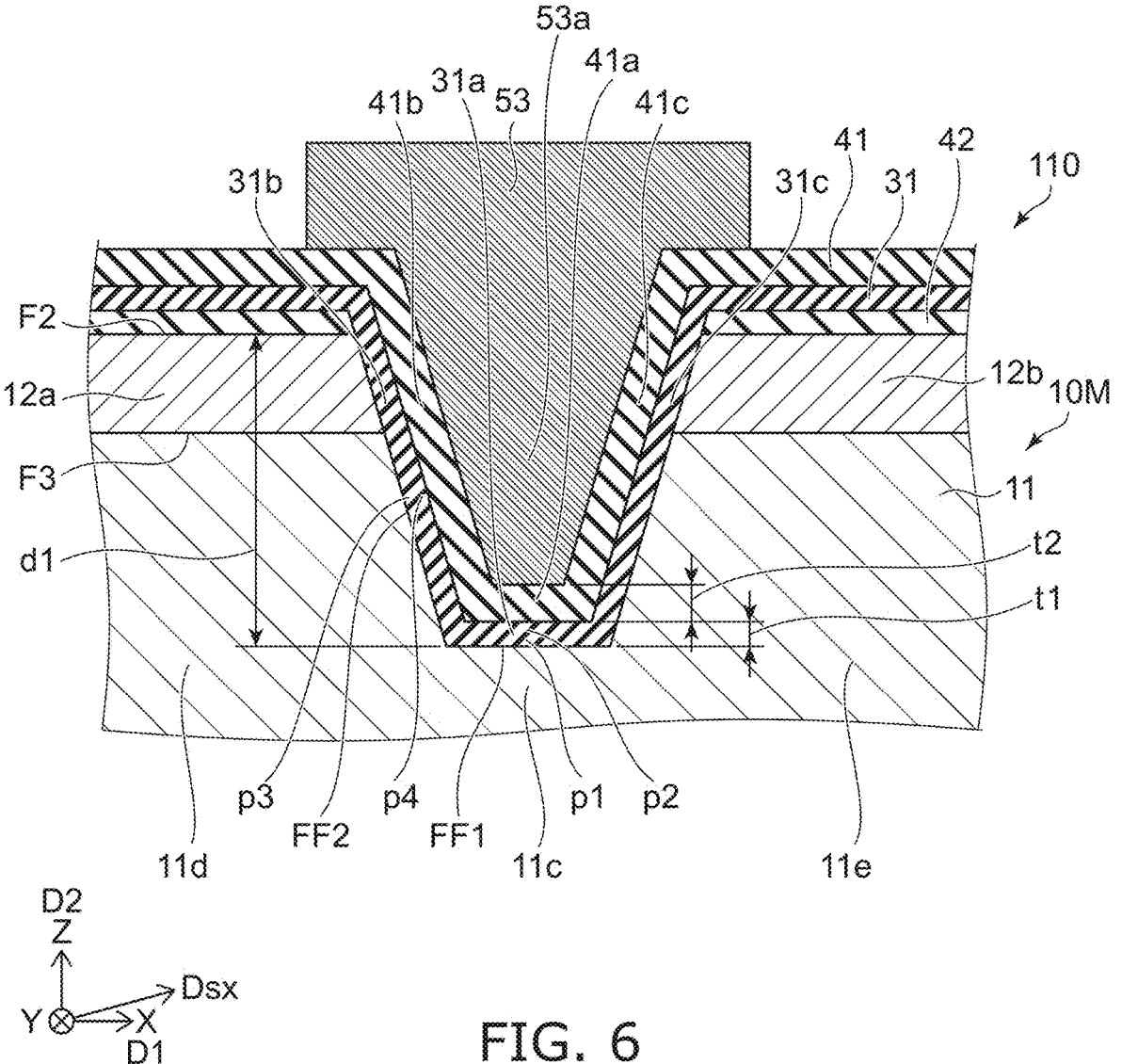
FIG. 6 is a schematic cross-sectional view illustrating a semiconductor device according to the first embodiment.

FIG. 6 is a schematic cross-sectional view illustrating the semiconductor device according to the first embodiment.

FIG. 6 is an enlarged view of a part of FIG. 1. As shown in FIG. 6, the first nitride region 31a includes a first portion p1 and a second portion p2. The first portion p1 is located between the third partial region 11c and the second portion p2 in the second direction D2. The crystallinity in the first portion p1 is higher than the crystallinity in the second portion p2. For example, the crystal of the first partial region p1 matches the crystal of the third partial region 11c. The second portion p2 is affected by the first insulating region 41a and has lower crystallinity than the first portion p1. By such a first nitride region 31a, high crystallinity can be obtained in the third partial region 11c.

As shown in FIG. 6, the second nitride region 31b includes a third portion p3 and a fourth portion p4. The third portion p3 is located between the first semiconductor portion 12a and the fourth portion p4 in the first direction D1. The crystallinity in the third portion p3 is higher than the crystallinity in the fourth portion p4. For example, the crystal of the third portion p3 matches the crystal of the first semiconductor portion 12a. The fourth portion p4 is affected by the second insulating region 41b and has lower crystallinity than the third portion p3. By such a second nitride region 31b, high crystallinity can be obtained in the first semiconductor portion 12a.

As shown in FIG. 6, the third partial region 11c includes the first facing surface FF1. The first facing surface FF1 faces the first nitride region 31a. The fourth partial region 11d includes the second facing surface FF2. The second facing surface FF2 faces the second nitride region 31b. An unevenness of the first facing surface FF1 is larger than an unevenness of the second facing surface FF2.

Large unevenness of the first facing surface FF1 makes it easier for Ga to diffuse from, for example, the third partial region 11c to the first nitride region 31a. The concentration of Ga in the first nitride region 31a can be stably increased.

As shown in FIG. 6, the thickness t1 of the first nitride region 31a along the second direction D2 is preferably, for example, not less than 1 nm or more and less than 5 nm. When the thickness t1 is 1 nm or more, the first nitride region 31a being uniform film-like can be obtained. When the thickness t1 is 5 nm or less, for example, control of the break down becomes easy. When the thickness t1 is thicker than 5 nm, for example, influence of the charge trap becomes large.

The thickness t2 of the first insulating region 41a along the second direction D2 is preferably, for example, not less than 5 nm and not more than 50 nm. When the thickness t2 is 5 nm or more, for example, good gate insulation reliability can be easily obtained. When the thickness t2 is 50 nm or less, for example, the electric field distribution control of the gate voltage becomes easy.

As shown in FIG. 6, the first semiconductor portion 12a includes the second surface F2 and the third surface F3. The third surface F3 faces the fourth partial region 11d. The third surface F3 is located between the fourth partial region 11d and the second surface F2 in the second direction D2. The second surface F2 is the opposite surface to the third surface F3. The second surface F2 is, for example, an upper surface. The distance along the second direction D2 between a position of the first facing surface FF1 in the second direction D2 and a position of the second surface F2 in the second direction D2 is defined as a distance d1. The distance d1 is preferably, for example, not less than 0.1 μm and not more than 1 μm. Thereby, for example, a high threshold voltage can be stably obtained easily. The distance d1 may be, for example, not less than 0.1 μm and not more than 0.5 μm. The distance d1 corresponds to, for example, the depth of the recess.

The above configuration described with respect to the second nitride region 31b can be applied to the third nitride region 31c.

The first nitride region 31a and the second nitride region 31b having different compositions from each other ss described above can be formed by various methods. For example, a recess is formed in the semiconductor member 10M, and a film to be the nitride member 31 is formed on the bottom surface and the side surface of the recess by, for example, a method such as ALD (Atomic Layer Deposition). By partially introducing Ga into this film, a region having a high concentration of Ga can be formed. The introduction of Ga into the film may be performed, for example, by using a gas including Ga at the time of forming the film. The introduction of Ga into the film may be performed by, for example, ion implantation. Alternatively, Al may be partially introduced into the film to form a compositional distribution. The introduction of Al into the film may be performed, for example, by using a gas including Al at the time of forming the film. The introduction of Al into the film may be performed by, for example, ion implantation.

For example, the first nitride region 31a and the second nitride region 31b may be formed by film formation using a mask.

For example, a recess is formed in the semiconductor member 10M, and the surface characteristics of the bottom and the side of the recess are made to be different. For example, the unevenness at the bottom of the recess is made larger than the unevenness at the side of the recess. A film to be the nitride member 31 is formed in such a recess. As a result, at the bottom of the recess, Ga in the third partial region 11c diffuses into the film that becomes the nitride member 31. On the other hand, in the side portion of the recess, Ga is difficult to diffuse from the fourth partial region 11d. Thus, the concentration of Ga in the nitride member 31 may be changed by changing the characteristics of the underlayer.

Second Embodiment

The second embodiment relates to a method for manufacturing a semiconductor device. The manufacturing method according to the embodiment includes forming a nitride film to be the nitride member 31 and introducing one of Ga and Al into a part of the nitride film. This makes it possible to form a plurality of regions having different compositions in the nitride member 31.

In the embodiment, at least one of the first electrode 51 and the second electrode 52 may include, for example, at least one selected from the group consisting of Ti and Al. The third electrode 53 may include, for example, at least one selected from the group consisting of TiN, WN, Ni, Au, Pt and Ti. The third electrode 53 may include, for example, conductive silicon or polysilicon.

Information on length and thickness can be obtained by observing with an electron microscope. Information on the composition of the material can be obtained by SIMS (Secondary Ion Mass Spectrometry) or EDX (Energy dispersive X-ray spectroscopy). EDX includes, for example, TEM-EDX.

According to the embodiment, it is possible to provide a semiconductor device whose characteristics can be improved.

In the embodiment, "nitride semiconductor" includes all compositions of semiconductors of the chemical formula $B_x In_y Al_z Ga_{1-x-y-z}N$ ($0 \leq x \leq 1$, $0 \leq y \leq 1$, $0 \leq z \leq 1$, and $x+y+z \leq 1$) for which the composition ratios x, y, and z are changed within the ranges respectively. "Nitride semiconductor" further includes group V elements other than N (nitrogen) in the chemical formula recited above, various elements added to control various properties such as the conductivity type and the like, and various elements included unintentionally.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as nitride regions, electrodes, insulating films, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices, and methods for manufacturing semiconductor devices practicable by an appropriate design modification by one skilled in the art based on the semiconductor devices, and the methods for manufacturing semiconductor devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode;
a second electrode;
a third electrode including a first electrode portion, a position of the first electrode portion in a first direction from the first electrode to the second electrode being between a position of the first electrode in the first direction and a position of the second electrode in the first direction;
a first semiconductor region including $Al_{x1}Ga_{1-x1}N$ ($0 \leq x1 < 1$), the first semiconductor region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;
a second semiconductor region including $Al_{x2}Ga_{1-x2}N$ ($0 < x2 \leq 1$, $x1 < x2$), the second semiconductor region including a first semiconductor portion and a second semiconductor portion, the first electrode portion being located between the first semiconductor portion and the second semiconductor portion in the first direction, a direction from the fourth partial region to the first semiconductor portion being along the second direction, a direction from the fifth partial region to the second semiconductor portion being along the second direction;
a first insulating member, the first insulating member including a first insulating region, a second insulating region, and a third insulating region, the first insulating region being located between the third partial region and the first electrode portion in the second direction, the second insulating region being located between the first semiconductor portion and the first electrode portion in the first direction, the third insulating region being located between the first electrode portion and the second semiconductor portion in the first direction; and
a nitride member including a first nitride region, a second nitride region and a third nitride region, the first nitride region being located between the third partial region and the first insulating region in the second direction, the second nitride region being located between the first semiconductor portion and the second insulating region in the first direction, the third nitride region being located between the third insulating region and the second semiconductor portion in the first direction, the first nitride region including $Al_{z1}Ga_{1-z1}N$ ($0<z1<1$, $x1<z1$), the second nitride region including $Al_{z2}Ga_{1-x2}N$ ($0<z2\leq1$, $z1<z2$), wherein the second nitride region includes AlN, and
the first nitride region includes AlGaN.

2. The device according to claim 1, wherein a concentration of Ga in the first nitride region is not less than 10 atm % and not more than 30 atm %.

3. A semiconductor device, comprising:

a first electrode;

a second electrode;

a third electrode including a first electrode portion, a position of the first electrode portion in a first direction from the first electrode to the second electrode being between a position of the first electrode in the first direction and a position of the second electrode in the first direction;

a first semiconductor region including $Al_{x1}Ga_{1-x1}N$ ($0\leq x1<1$), the first semiconductor region including a first partial region, a second partial region, a third partial region, a fourth partial region, and a fifth partial region, a direction from the first partial region to the first electrode being along a second direction crossing the first direction, a direction from the second partial region to the second electrode being along the second direction, a direction from the third partial region to the first electrode portion being along the second direction, a position of the fourth partial region in the first direction being between a position of the first partial region in the first direction and a position of the third partial region in the first direction, a position of the fifth partial region in the first direction being between the position of the third partial region in the first direction and a position of the second partial region in the first direction;

a second semiconductor region including $Al_{x2}Ga_{1-x2}N$ ($0<x2\leq1$, $x1<x2$), the second semiconductor region including a first semiconductor portion and a second semiconductor portion, the first electrode portion being located between the first semiconductor portion and the second semiconductor portion in the first direction, a direction from the fourth partial region to the first semiconductor portion being along the second direction, a direction from the fifth partial region to the second semiconductor portion being along the second direction;

a first insulating member, the first insulating member including a first insulating region, a second insulating region, and a third insulating region, the first insulating region being located between the third partial region and the first electrode portion in the second direction, the second insulating region being located between the first semiconductor portion and the first electrode portion in the first direction, the third insulating region being located between the first electrode portion and the second semiconductor portion in the first direction; and a nitride member including a first nitride region, a second nitride region and a third nitride region, the first nitride region being located between the third partial region and the first insulating region in the second direction, the second nitride region being located between the first semiconductor portion and the second insulating region in the first direction, the third nitride region being located between the third insulating region and the second semiconductor portion in the first direction, the first nitride region including $Al_{z1}Ga_{1-z1}N$ ($0<z1<1$, $x1<z1$), the second nitride region including $Al_{z2}Ga_{1-z2}N$ ($0<z2\leq1$, $z1<z2$), wherein a crystallinity of the second nitride region is higher than a crystallinity of the first nitride region.

4. The device according to claim 1, wherein the first nitride region includes a first portion and a second portion, the first portion is located between the third partial region and the second portion in the second direction, and a crystallinity in the first portion is higher than a crystallinity in the second portion.

5. The device according to claim 1, wherein the second nitride region includes a first portion and a second portion, the first portion is located between the first semiconductor portion and the second portion in the first direction, and a crystallinity in the first portion is higher than a crystallinity in the second portion.

6. The device according to claim 1, wherein the third nitride region includes $Al_{z3}Ga_{1-z3}N$ ($0<z3\leq1$, $z1<z3$).

7. The device according to claim 6, wherein the third nitride region includes AlN.

8. The device according to claim 1, wherein a part of the first electrode portion is located between the fourth partial region and the fifth partial region in the first direction.

9. The device according to claim 1, wherein a thickness of the first nitride region along the second direction is not less than 1 nm and not more than 5 nm.

10. The device according to claim 1, wherein a thickness of the first insulating region along the second direction is not less than 5 nm and not more than 50 nm.

11. The device according to claim 1, wherein the first insulating member includes silicon and oxygen.

12. The device according to claim 1, further comprising a second insulating member, the second insulating member including a first insulating portion and a second insulating portion, the first semiconductor portion being located between the fourth partial region and the first insulating portion in the second direction, the second semiconductor portion being located between the fifth partial region and the second insulating portion in the second direction, and the second insulating member including silicon and nitrogen.

13. The device according to claim 12, wherein the nitride member includes a fourth nitride region and a fifth nitride region, the first insulating portion is located between the first semiconductor portion and the fourth nitride region in the second direction, and the second insulating portion is located between the second semiconductor portion and the fifth nitride region in the second direction.

14. The device according to claim 13, wherein the first insulating member includes a fourth insulating region and a fifth insulating region, the fourth nitride region is located between the first insulating portion and the fourth insulating region in the second direction, and the fifth nitride region is located between the second insulating portion and the fifth insulating region in the second direction.

15. The device according to claim 1, wherein a concentration of Al at a first position included in the first nitride region is a peak in a distribution of the concentration of Al along the second direction in the first nitride region, and a concentration of Ga in the first position is $\frac{1}{10}$ or more of a concentration of Ga in the third partial region.

16. The device according to claim 1, wherein the second nitride region includes a first surface facing the fourth partial region, a concentration of Al at a first position included in the second nitride region is a peak in a distribution of the concentration of Al along a side vertical direction in the second nitride region, the side vertical direction is perpendicular to the first surface, and a concentration of Ga in the first position is less than $\frac{1}{10}$ of a concentration of Ga in the fourth partial region.

17. The device according to claim 1, wherein z2 is higher than x2.

18. The device according to claim 1, wherein x1 is not less than 0 and less than 0.1, and x2 is not less than 0.1 and not more than 0.5.

19. The device according to claim 1, wherein the third partial region includes a first facing surface facing the first nitride region, the fourth partial region includes a second facing surface facing the second nitride region, and an unevenness of the first facing surface is larger than an unevenness of the second facing surface.

20. The device according to claim 1, wherein the nitride member is configured to suppress carrier concentration in the third partial region.

* * * * *